United States Patent [19]

Izakson et al.

[11] 4,207,543
[45] Jun. 10, 1980

[54] ADAPTIVE FILTER NETWORK

[76] Inventors: Ilya S. Izakson, ulitsa Vetrova, 21, kv. 4; Arnold B. Nikolaenko, ulitsa Scherbakova, 82a, kv. 28, both of Kiev, U.S.S.R.

[21] Appl. No.: 925,683

[22] Filed: Jul. 18, 1978

[51] Int. Cl.² ............................................. H03H 7/10
[52] U.S. Cl. .................................. 333/17 R; 179/1 D; 179/1 P; 328/167; 330/107; 330/149; 330/294; 330/305
[58] Field of Search ...................... 333/17 R; 328/167; 325/477; 179/1 D, 1 P, 1 VC; 330/107, 109, 149, 294, 305

[56] References Cited

U.S. PATENT DOCUMENTS

| | | | |
|---|---|---|---|
| 3,678,416 | 7/1972 | Burwen | 333/17 R |
| 3,714,588 | 1/1973 | Deboo et al. | 328/167 |
| 3,753,159 | 8/1973 | Burwen | 333/17 R |

*Primary Examiner*—Paul L. Gensler
*Attorney, Agent, or Firm*—Fleit & Jacobson

[57] ABSTRACT

An adaptive filter network comprising a controllable filter having an adjustable cut-off frequency and adapted for varying the pass-band of the network. The adaptive filter network further includes a serial arrangement of an algebraic adder for generating control signals, connected to the controllable filter; a weighting filter for converting the control signal spectrum in response to the load sensitivity variation with frequency; a threshold limiter for setting the noise reduction threshold level of the adaptive filter network; a control signal frequency corrector; and an amplitude detector for shaping control signals applied to the control input of the controllable filter. The network analysis of the input audio signal spectrum and the width of its pass-band is varied depending on the present frequency limit of the input audio signal wanted components.

8 Claims, 4 Drawing Figures

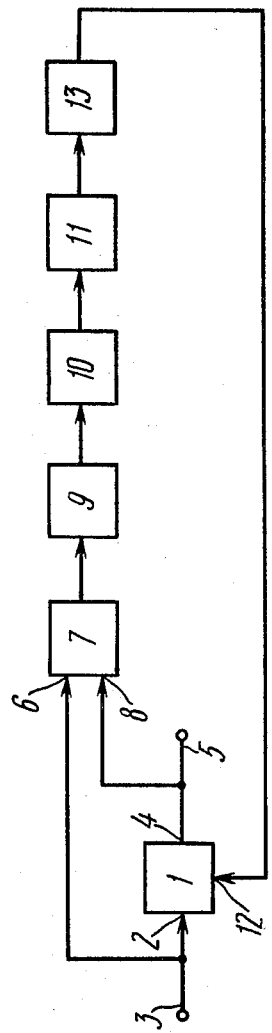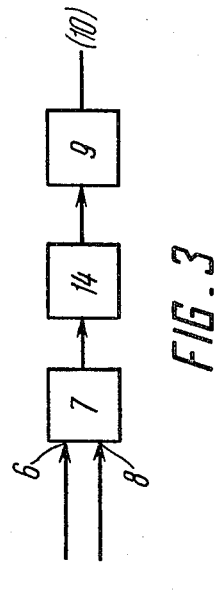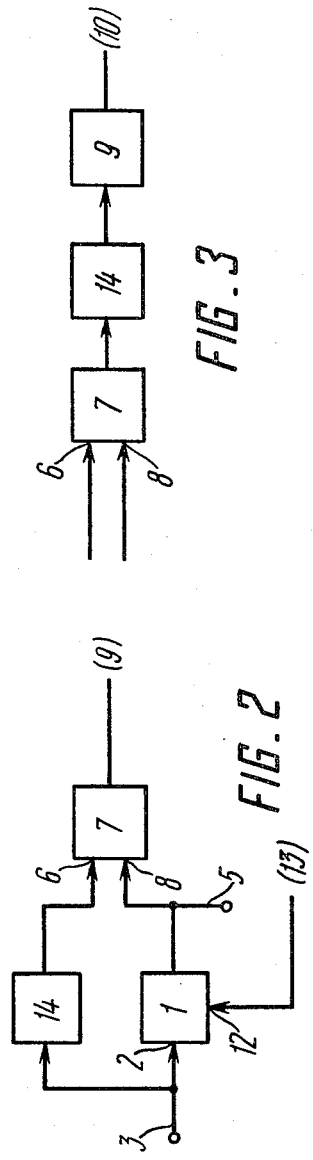

ADAPTIVE FILTER NETWORK

FIELD OF THE INVENTION

The invention relates to frequency-selective networks with adjustable characteristics, and more particularly to adaptive filter networks incorporated in sound recording and reproduction systems wherein it is desirable to reduce noise effects.

DESCRIPTION OF THE PRIOR ART

In the recording and reproduction of audio signals, the noise components occuring at frequencies with the desired signal components of higher levels are inaudible due to the ear's masking properties. On the other hand, the noise components with frequencies not containing the desired signal components are perceived by the ear with the result that the program material is distorted. In order to eliminate these latter unmasked noise components and to pass the desired signal components, it is common practice to vary the pass-band in which the frequency spectrum of sound recording and reproduction systems lies.

Known in the art is a noise reduction device (cf. Application made in Netherlands, No. 710,869, Int.Cl.2H 03C, 1972) comprising a phase shifter having its input coupled to the output of the device. The phase shifter has two outputs which connect the inputs of an adder in a direct way and via an additional signal processing channel. The latter comprises a serial arrangement of a high-pass filter which passes the signal components with frequencies exceeding 4.5 kHz, a peak limiter and an automatic gain control unit.

The device filters out the signals dynamically. This means that at frequencies higher than 4.5 kHz its transmission coefficient depends on the level of the components of the input signal at the above frequencies and decreases with a decrease in that level. The transmission factor is varied by subtracting the components of the input signal at frequencies higher than 4.5 kHz from a wide-band signal. The subtraction achieves its maximum only at a single frequency for which a 180° phase shift is available, which causes a partial reduction in the high-frequency noise.

The described device therefore provides for a low noise reduction of 3–5 dB for frequencies exceeding 4.5 kHz.

Known in the art is a dynamic noise-reducing filter (cf. U.S. Pat. No. 3,678,416, Cl. 337/17, Published July 18, 1972) comprising a means for controlling the cut-off frequency. The means incorporates controllable low- and high-pass filters with adjustable cut-off frequencies and control circuits. Each of the control circuits is comprised of a filter network with a pass-band that spans the adjustment range of the cut-off frequency of its respective controllable filter, an amplifier, and an amplitude detector. To adjust the cut-off frequencies of the controllable low- and high-pass filters, their control circuits are subjected to the action of the signals delivered from the input of said means via high- and low-pass filters, respectively. As a result, the above cut-off frequencies are adjusted depending on the level of the signal components that are passed in the control circuits via the high- and low-pass filters, respectively. Larger inputs to the means result in narrower pass-bands of the controllable filters and in lower levels of the output noise. With smaller inputs to the means, the pass-bands are extended, but an increased noise level is imperceptible to the listener since loud sounds mask out soft ones.

In the described filter, it is impossible, however, to reduce modulation noise during the adjustment as the cut-off frequencies of the controllable filters are adjusted inaccurately. This is due to the fact that the cut-off frequencies are adjusted depending on the level of the components of the input signal lying in the pass-bands of the noncontrollable filter networks of the control circuits. It is known that the envelope of the mean statistical frequency spectrum of an audio signal program tends to drop in regions below 400 Hz and above 1500 Hz. Since the cut-off frequencies of the filter networks of the control circuits assume fixed values of 300 and 1000 Hz, higher levels of the signal components lying near these values cause the adjustment of the cut-off frequencies of the controllable filters so that they reach the limits of the operating frequency range. As a result, noise is audible at frequencies occuring in the vicinity of these limits in the absence of masking signal components. When the level of the medium frequency components of the signal varies and when a low level of the components, if any, is present at the limits of the operating frequency range, a variation of noise level, i.e., modulation noise, is audible.

The invention therefore seeks to achieve an adaptive filter network which can provide for the adjustment of the pass-band of sound recording and reproduction systems depending on the frequency limit of the wanted components of the input audio signal.

SUMMARY OF THE INVENTION

The principal object of the invention is to provide an adaptive filter network which can provide for a higher reduction of noise encountered in sound recording and reproducing systems, as compared with similar networks known in the art.

Another object of the invention is to provide an adaptive filter network which can provide for a reduced audible modulation noise.

A still another object of the invention is to provide an adaptive filter network with an adjustable pass-band, having its cut-off frequency controllable with a higher degree of precision depending on the frequency limit of the wanted components of the input audio signal.

Another object of the invention is to provide an adaptive filter network which can change its pass-band in accordance with the sensitivity of the applied signal.

Yet another object of the invention is to provide an adaptive filter network having an adjustable noise reduction threshold level.

There is disclosed an adaptive filter network incorporating a controllable filter with an adjustable cut-off frequency, having its input and its output serving, respectively, as the input and the output of the adaptive filter network and coupled to the input of an amplitude detector whose output is coupled to a control input of the controllable filter, which adaptive filter network comprises, according to the invention, a serial arrangement of an algebraic adder which produces control signals, a weighting filter which translates the control signal spectrum, a threshold limiter which sets the noise reduction threshold level, and a control signal frequency corrector, one of the inputs of the algebraic adder being coupled to the input of the controllable filter, the second input of the algebraic adder being coupled to the output of the controllable filter, and the output of the control signal frequency corrector being coupled to the input of the amplitude detector.

The described embodiment makes it possible to adjust the cut-off frequency of the controllable filter depending on the frequency limit of the wanted components of the input signal. The pass-band of the adaptive filter network therefore becomes wider with a higher frequency limit of the components of the input signal exceeding the threshold level. On the other hand, the pass-band of the network becomes narrower in the absence of, say, high-frequency components of the signal, which is held true for both low and high levels of medium-frequency components.

As a result, the cut-off frequency can be adjusted to a higher degree of accuracy with the result that the adaptive filter network provides for intensive noise reduction and reduced perception of modulation noise.

Preferably, the adaptive filter network comprises a noncontrollable filter with a pass-band equal to the maximum pass-band of the controllable filter, the input of the noncontrollable filter being coupled to the input of the adaptive filter network, and the output of the noncontrollable filter being coupled to the input of the threshold limiter.

This embodiment precludes the appearance of the components of the input signal lying outside of the operating frequency range on the control input of the controllable filter, thus eliminating the production of false control signals.

It is preferable that the adaptive filter network comprises the noncontrollable filter having its input coupled to the input of the controllable filter and its output coupled to one of the inputs of the algebraic adder.

In this embodiment, the components of the input signal occuring within the pass-band of the controllable filter are suppressed at the output of the algebraic adder as much as possible. This is attained in a condition where the amplitude-frequency and phase-frequency response characteristics of the controllable and noncontrollable filters fit one another precisely with the cut-off frequency of the controllable filter adjusted to the frequency limit of the operating frequency range.

It is advantageous that the adaptive filter network comprises the noncontrollable filter having its input coupled to the output of the algebraic adder and its output coupled to the input of the weighting filter.

This embodiment provides for the noncontrollable filter having its amplitude-frequency response characteristic with more steep slopes outside of the pass-band with the result that the appearance of the signal components extending beyond the operating frequency range on the control input of the controllable filter is preluded to a greater extent. Under these conditions, it is possible to maintain a random phase-frequency response characteristic of the noncontrollable filter within the pass-band.

Preferably, the adaptive filter network comprises the control signal frequency corrector made as an integrator and the controllable filter made as a high-pass filter for the operating frequency range.

This embodiment provides for reduction of the unwanted unmasked low-frequency components occuring in the audio frequency range.

Advantageously, the adaptive filter network comprises the control frequency corrector made as a differentiator and the controllable filter made as a low-pass filter.

This embodiment provides for reduction of the unwanted unmasked high-frequency components occuring in the audio frequency range.

DESCRIPTION OF THE DRAWINGS

The invention will now be described, by way of example, with reference to the accompanying drawings in which:

FIG. 1 is a block diagram of an adaptive filter network, according to the invention;

FIG. 2 is part of a block diagram of an embodiment of the adaptive filter network designed to suppress, as much as possible, the components of the input signal at the output of the algebraic adder, according to the invention;

FIG. 3 is part of a block diagram of another embodiment of the adaptive filter network designed to eliminate the production of false control signals in the case of a random phase-frequency response characteristic of the noncontrollable filter in its pass-band, according to the invention;

DESCRIPTION OF THE INVENTION

Figure 4:
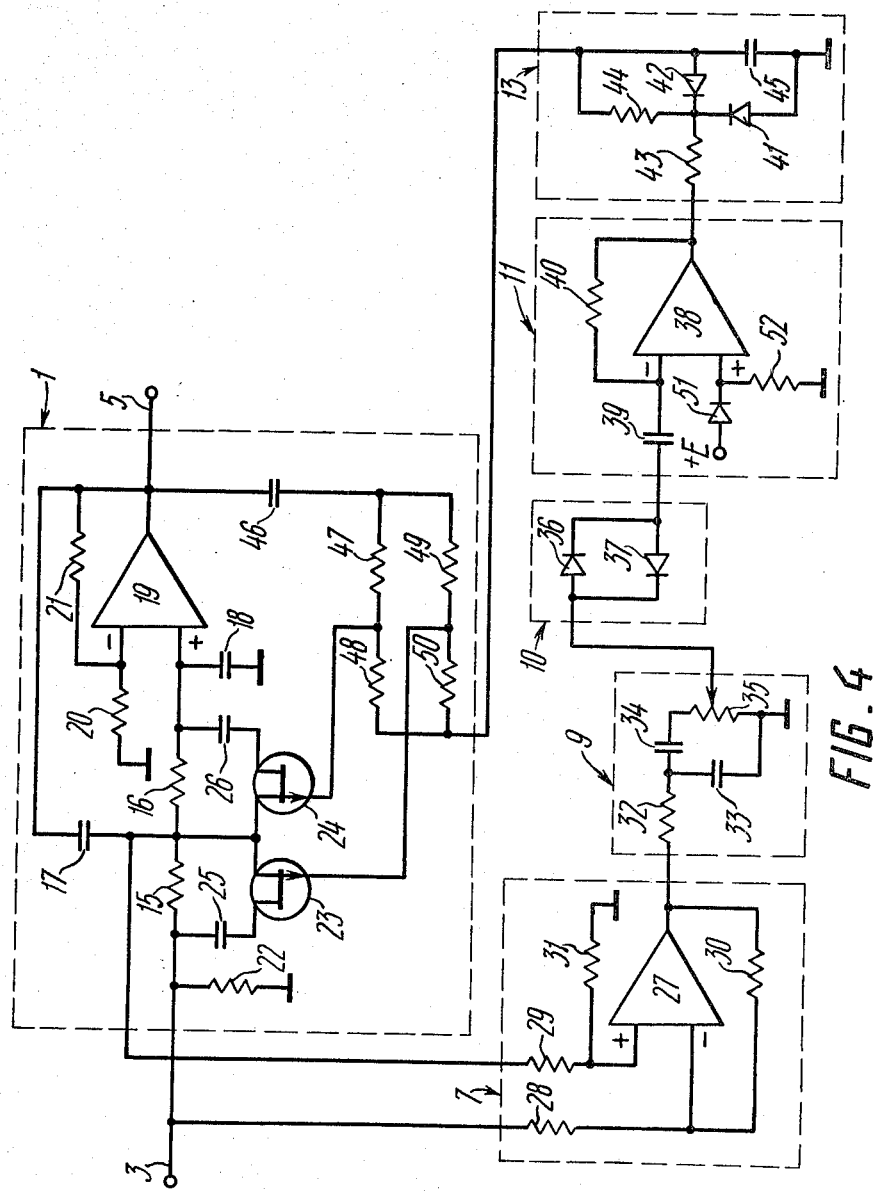
FIG. 4 is a circuit diagram of a still another embodiment of the adaptive filter network designed to suppress the high-frequency noise components.

The adaptive filter network of the invention (FIG. 1) comprises a controllable filter 1 (FIG. 1) with an adjustable cut-off frequency, used to change the pass-band of the network. An input 2 of the controllable filter 1 is connected to an input 3 of the adaptive filter network. An output 4 of the controllable filter 1 is connected to an output 5 of the adaptive filter network. The input 2 of the controllable filter 1 is also connected to an input 6 of an algebraic adder 7 whose input 8 is connected the output 4 of the controllable filter 1.

The algebraic adder 7 generates control signals having a frequency band equal to the difference of the frequency bands of the input and output signals of the controllable filter 1; this is done by subtracting the components lying within the pass-band of the controllable filter 1 from the content of the input signal.

The output of the algebraic adder 7 is connected to the input of a weighting filter 9 which forms different control signals as the ear's sensitivity varies, with the audio signal frequency.

The weighting filter 9 may be constructed in the form of parallel-connected band-pass filters having adjustable transmission coefficients so as to enable its amplitude-frequency response characteristic to be adjusted.

The output of the weighting filter 9 is connected to the input of a threshold limiter 10 the limit level of which determines the noise reduction threshold of the adaptive filter network.

The output of the threshold limiter 10 is connected to the input of a control signal frequency corrector 11 which operates to vary the control signal level at a control input 12 of the controllable filter 1 as the frequency of the latter is varied.

The output of the control signal frequency corrector 11 is connected to the input of an amplitude detector 13 whose output is connected to a control input 12 of the controllable filter 1. The amplitude detector 13 operates to rectify control signals passed to its input from the output of the control signal frequency corrector 11.

FIG. 2 shows part of a block diagram of an embodiment of the adaptive filter network permitting a maximum suppression of the input signal components at the output of the algebraic adder 7. Here, the input of a noncontrollable filter 14 is connected to the input 2 of the controllable filter 1, whereas the output of the filter 14 is connected to the input 6 of the algebraic adder 7.

FIG. 3 shows part of a block diagram of another embodiment of the adaptive filter network designed to eliminate the production of false control signals in the case of a random phase-frequency response characteristic of the noncontrollable filter 14 within its pass-band. Here, the input of the noncontrollable filter 14 is connected to the output of the algebraic adder 7, whereas the output of the filter 14 is connected to the input of the weighting filter 9.

FIG. 4 represents a circuit diagram of a still another embodiment of the adaptive filter network designed to suppress the high-frequency noise components.

The adaptive filter network comprises a controllable low-pass filter 1 constructed as a second-order active filter the passive elements of which are resistors 15, 16 and capacitors 17, 18. An operational amplifier 19 is used as an active element. The resistors 15, 16 are connected in series between the input 3 of the adaptive filter network and the non-inverting input of the operational amplifier 19. Between the connection point of the resistors 15, 16 and the output of the operational amplifier 19 there is connected the capacitor 17 to form a positive feedback circuit. Between the non-inverting input of the operational amplifier 19 and the ground there is connected the capacitor 18. Between the inverting input of the operational amplifier 19 and the ground there is connected a resistor 20, whereas between the inverting input of the operational amplifier 19 and the output thereof there is connected a resistor 21. The resistance ratio of the resistors 21 and 20 forming a negative feedback circuit, determines the transmission coefficient of the operational amplifier 19. Between the input of the adaptive filter network and the ground there is connected a resistor 22. The resistors 22, 15, 16, connected in series with one another, are responsible for the d.c. condition of the non-inverting input of the operational amplifier 19.

Field effect transistors 23, 24 are connected in parallel to the resistors 15 and 16. The sources of the field effect transistors 23, 24 are combined and connected to the common connection point of the resistors 15, 16. The drain of the field effect transistor 23 is connected, through a blocking capacitor 25, to the input 3 of the adaptive filter network, whereas the drain of the field effect transistor 24 is connected, through a blocking capacitor 26, to the non-inverting input of the operational amplifier 19. The field effect transistors 23, 24 serve as variable resistors. The blocking capacitors 25, 26 prevent the direct current from passing through the channels of the field effect transistors 23 and 24, thus eliminating the inherent noise of the control process.

The output of the operational amplifier 19 is connected to the output 5 of the adaptive filter network.

The algebraic adder 7 is basically made as an operational amplifier 27 having its inverting input connected, through a resistor 28, to the input 3 of the adaptive filter network, and having its non-inverting input connected, through a resistor 29, to the connection point of the resistors 15, 16, said point being used as the output of the first section of the controllable filter 1. The output of the operational amplifier 27 is connected through a resistor 30, to the inverting input of the operational amplifier 27 whose non-inverting input is grounded through a resistor 31. The resistances of the resistors 28, 30 are equal to those of the resistors 29, 31 respectively.

The transmission coefficient of the algebraic adder 7 is determined by the resistance ratio of the resistors 30, 28. In this arrangement, the incoming inphase signals available from the input and the filtered output of the controllable filter 1 are subtracted from each other. The algebraic adder 7 is connected to the controllable filter 1 since the phase distortion caused by the controllable filter 1 is less than that caused by the entire filter network. This provides for high attenuation of the signal components, lying within the pass-band of the controllable filter 1, and at the output of the algebraic adder 7, so that they could not affect considerably the adjustment of the cut-off frequency of the controllable filter 1.

The input of the weighting filter 9 is connected to the output of the algebraic adder 7.

The weighting filter 9 is a band-pass filter incorporating two conventional R-C circuits. The first R-C circuit including a resistor 32 and a capacitor 33, is used as a low-pass filter. The second R-C circuit, including a capacitor 34 and a variable resistor 35, is used as a high-pass filter. The cut-off frequency of the both filters is selected so that the transmission coefficient of the weighting filter 9 has its maximum within the audio medium frequency range and decreases on both sides of this maximum.

The threshold limiter 10 is connected with its input to the cursor of the variable resistor 35 controlling the noise reduction threshold. The threshold limiter 10 comprises diodes 36 and 37 connected in parallel opposition.

The output of the threshold limiter 10 is connected to the input of the control signal frequency corrector 11 (differentiator) comprising an operational amplifier 38. Between the output of the threshold limiter 10 and the inverting input of the operational amplifier 38 there is connected a capacitor 39, whereas between the inverting input and the output there connected a negative feedback resistor 40.

To the output of the differentiator there is connected the amplitude detector 13 comprising diodes 41, 42, resistors 43, 44, and a capacitor 45.

Between the output of the amplitude detector 13 and the output of the operational amplifier 19 there are parallel connected, through a capacitor 46, resistance dividers comprised of resistors 47, 48, 49, 50. To the connection point of the resistors 47 and 48 there is connected the gate of the field effect transistor 24, and to the connection point of the resistors 49, 50 there is connected the gate of the field effect transistor 23. The gates of the field effect transistors 23, 24 are fed, through said resistance dividers with the signal from the output of the operational amplifier 19 to compensate for non-linear distortion.

In the initial state the field effect transistors 23 and 24 are rendered non-conductive by the direct voltage applied to their gates from the output of the operational amplifier 38 through the resistors 43, 44, 48 and 50, said voltage being set at the non-inverting input of the operational amplifier 38 by a diode 51 and a resistor 52 coupled in series and connected to a source of reference voltage $+E$.

The diode 51 serves as a thermocompensation element for stabilizing the channel resistance of the field effect transistors 23, 24. With an increase of the surrounding temperature, the channel resistance of the field effect transistors 23, 24 decreases. Simultaneously, the voltage across the diode 51 decreases, while the voltage across the resistor 52 increases, which causes the field effect transistors 23, 24 to stop conducting and results in an increase in the channel resistance thereof.

A germanium diode 41, connected to the output of the operational amplifier 38 through resistor 43, is designed for preventing the gate-source junctions of the field effect transistors 23, 24 from being inversely energized in the dynamic mode.

Since the sound reproduction and recording are affected most of all by the interference of the medium- and high-frequency noise components, the most preferred embodiment of the invention is an adaptive filter network having a controllable low-pass filter and a differentiator serving as a control signal frequency corrector.

The adaptive filter network of the above construction operates as follows.

When no signal is applied to the input 3, at the output 4 of the low-pass controllable filter 1 and, hence, at the output 5 and the input 8 of the algebraic adder 7 there are present only the narrow-band noise components lying within the initial pass-band of the controllable filter 1, whereas at the input 6 of the algebraic adder 7 there is present a wide-band noise passing from the input 3.

As a result of subtraction of the narrow-band noise from the wide-band one, at the output of the algebraic adder 7 there remain only the high-frequency noise components which, through the weighting filter 9 pass to the threshold limiter 10. Note that in this case the limit level of the threshold limiter 10, determining the noise reduction threshold, is higher than the noise components level at the input of said limiter 10 so that no signal appears at its output and, therefore, the cut-off frequency of the controllable filter 1 does not vary. Thus, in the absence of the signal, the frequency band of the network is limited with respect to its upper end with the result that the noise components occuring above the reference cut-off frequency of the controllable filter 1 are reduced and non-perceptible.

At moments the signal is applied to the input 3, at the output 4 of the controllable filter 1 and, hence, at the input 8 of the algebraic adder 7 there appears the input signal low-frequency components lying within the initial pass-band of the controllable filter 1.

At the input 6 of the algebraic adder 7 there are present all the input signal components of the operating frequency range. As a result of subtraction of the signal low-frequency components, at the output of the algebraic adder 7 there are present only the high-frequency components of the signal. These components are fed through the weighting filter 9 to the input of the threshold limiter 10. If the level of the high-frequency components at the input of the threshold limiter 10 exceeds a preset limit threshold, at the output of the limiter 10 there appears a signal which is corrected by the control signal frequency corrector 11 which, according to this embodiment of the invention, is a differentiator. From the output of the control signal frequency corrector 11 the signal is fed to the input of the amplitude detector 13, and, when rectified in the latter, is further fed to the control input of the controllable filter 1 whose cut-off frequency is therefore caused to occur at the higher frequency end.

The high-frequency components of the input signal, which exceed a predetermined noise reduction threshold value, are passed to the output 5 of the adaptive filter network without attenuation. To the output 5 of the adaptive filter network there are fed without being reduced the signal high frequency components being present in the input signal and exceeding a predetermined noise reduction threshold. Simultaneously, the algebraic adder 7 subtracts from the wide-band signal the signal components lying within the extended pass-band of the controllable filter 1. As a result, more intensive components adjacent the cut-off frequency of the controllable filter 1 are removed from the control signal high-frequency components and do not affect noticeably further adjustment of the cut-off frequency.

As the input signal spectrum gets wider, extending to the region of the high frequencies having components level exceeding the predetermined noise reduction threshold, the cut-off frequency of the controllable filter 1 is so adjusted that it reaches the upper frequency limit of the operating frequency range, permitting all the signal components to be passed to the output 5 without attenuation.

Despite the widening of the frequency band of the network, the high-frequency noise occuring in the signal is not perceptible due to the ear's masking properties. As the spectrum of the input signal gets narrower and the high-frequency components level is reduced, the network is operated so that the cut-off frequency decreases and the high-frequency noise at its output is attenuated.

An adaptive filter network having a controllable high-pass filter operates in a like manner and the control signal frequency corrector 11 is an integrator in this case.

In special radio apparatus it is possible to use a controllable low-pass filter in combination with a controllable high-pass filter, so that a band-pass filter is realized in which the upper and lower cut-off frequencies are adjusted independently.

What is claimed is:

1. An adaptive filter network comprising a controllable filter having an adjustable cut-off frequency and adapted for varying the pass band of said adaptive filter network, said controllable filter having an input and an output connected respectively to the input and output of said adaptive filter network, and a control input; an algebraic adder for generating control signals, having one input connected to said input of said controllable filter and the other input connected to said output of said controllable filter, and having an output; a weighting filter for converting the control signal spectrum in response to the variation of the load sensitivity with frequency by varying the transmission coefficient of the control signal spectrum components, said weighting filter having its input connected to said output of said algebraic adder, and having an output; a threshold limiter for setting the noise reduction threshold level of said adaptive filter, said threshold limiter having an input connected to said output of said weighting filter, and having an output; a control signal frequency corrector for varying the control signal level at said control input of said controllable filter depending on its frequency, having an input connected to said output of said threshold limiter, and having an output; an amplitude detector for shaping control signals applied to said control input of said controllable filter, having an input connected to said output of said frequency corrector and having an output connected to said control input of said controllable filter.

2. An adaptive filter network as claimed in claim 1, comprising a noncontrollable filter having its pass band equal to the frequency range of the wanted signal and adapted to preclude the occurrence, at the control input of the controllable filter, of the input signal components lying beyond the operating frequency range and the formation of false control signals, the input and output of said noncontrollable filter being connected respectively to the input and the control input of the controllable filter.

3. An adaptive filter network as claimed in claim 1, wherein the controllable filter is a low-pass and the control signal frequency corrector is a differentiator providing for a directly proportional relationship between the control signal level at said control input of the controllable filter and the control signal frequency.

4. An adaptive filter network as claimed in claim 1, wherein the controllable filter is a high-pass filter and the control signal frequency corrector is formed as an integrator providing for an inversely proportional relationship between the control signal level oat the control input of the controllable filter and the control signal frequency.

5. An adaptive filter network as claimed in claim 2, wherein the noncontrollable filter is connected between the input of the controllable filter and one of the inputs of the algebraic adder.

6. An adaptive filter network as claimed in claim 2, wherein the noncontrollable filter is connected between the output of the algebraic adder and the input of the weighting filter.

7. An adaptive filter network as claimed in claim 2, wherein the controllable filter is a low-pass controllable filter and the control signal frequency corrector is a differentiator providing for a directly proportional relationship between the control signal level at said control input of said low-pass controllable filter and the control signal frequency.

8. An adaptive filter network as claimed in claim 2, wherein the controllable filter is a high-pass filter and the control signal frequency corrector is an integrator providing for an inversely proportional relationship between the control signal level at the control input of the controllable filter and the control signal frequency.

* * * * *